(12) United States Patent
Corisis

(10) Patent No.: US 6,376,282 B1
(45) Date of Patent: Apr. 23, 2002

(54) INNER-DIGITIZED BOND FINGERS ON BUS BARS OF SEMICONDUCTOR DEVICE PACKAGE

(75) Inventor: David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/521,056

(22) Filed: Mar. 7, 2000

Related U.S. Application Data

(62) Division of application No. 08/980,151, filed on Nov. 26, 1997, now Pat. No. 6,144,089.

(51) Int. Cl.[7] .............................................. H01L 21/50
(52) U.S. Cl. ...................... 438/123; 438/121; 438/124
(58) Field of Search ................................ 438/123, 121, 438/124

(56) References Cited

U.S. PATENT DOCUMENTS

| | | |
|---|---|---|
| 4,410,905 A | 10/1983 | Grabbe |
| 4,595,945 A | 6/1986 | Graver |
| 4,780,795 A | 10/1988 | Meinel |
| 4,862,245 A | 8/1989 | Pashby et al. |
| 4,937,656 A | 6/1990 | Kohara |
| 4,949,161 A | 8/1990 | Allen et al. |
| 5,086,018 A | 2/1992 | Conru et al. |
| 5,147,815 A | 9/1992 | Castro |
| 5,218,168 A | 6/1993 | Mitchell et al. |
| 5,229,329 A | 7/1993 | Chai et al. |
| 5,229,639 A | 7/1993 | Hansen et al. |
| 5,233,220 A | 8/1993 | Lamson et al. |
| 5,250,840 A | 10/1993 | Oh et al. |
| 5,256,598 A | 10/1993 | Farnworth et al. |
| 5,303,120 A | 4/1994 | Michii et al. |
| 5,327,009 A | 7/1994 | Igeta |
| 5,331,200 A | 7/1994 | Teo et al. |
| 5,360,992 A | 11/1994 | Lowrey et al. |
| 5,381,036 A | 1/1995 | Bigler et al. |
| 5,384,488 A | 1/1995 | Golshan et al. |
| 5,396,701 A | 3/1995 | Russell |
| 5,434,106 A | 7/1995 | Lim et al. |
| 5,438,478 A | 8/1995 | Kondo et al. |
| 5,508,565 A | 4/1996 | Hatakeyama et al. |
| 5,519,576 A | 5/1996 | Moore |
| 5,521,426 A | 5/1996 | Russell |
| 5,523,617 A | 6/1996 | Asanasavest |
| 5,528,075 A | 6/1996 | Burns |
| 5,530,292 A | 6/1996 | Waki et al. |
| 5,532,189 A | 7/1996 | Kiyono |
| 5,541,446 A | 7/1996 | Kierse |
| 5,563,443 A | 10/1996 | Beng et al. |

(List continued on next page.)

FOREIGN PATENT DOCUMENTS

| | | |
|---|---|---|
| JP | 5-109979 | 4/1993 |

\* cited by examiner

*Primary Examiner*—Charles Bowers
*Assistant Examiner*—Stephen W. Smoot
(74) *Attorney, Agent, or Firm*—Traskbritt

(57) ABSTRACT

A semiconductor device package is formed with a lead frame including a plurality of lead members positioned in an array, and a semiconductor die is secured to the lead frame. At least one pair of bus bars is connected to the lead frame and positioned over the semiconductor die, with the bus bars including a plurality of inner-digitized bond fingers. The inner-digitized bond fingers are formed from a series of alternating projections and recesses on each bus bar. A plurality of bond wires electrically couples the lead members to the semiconductor die. Other bond wires electrically couple the inner-digitized bond fingers of the bus bars to the semiconductor die. The bond wires attached to the inner-digitized bond fingers have a substantially uniform loop height and length, providing for easier manufacture and inspection of the semiconductor device package.

46 Claims, 2 Drawing Sheets

U.S. PATENT DOCUMENTS

| | | |
|---|---|---|
| 5,585,667 A | 12/1996 | Asanasavest |
| 5,585,668 A | 12/1996 | Burns |
| 5,589,420 A | 12/1996 | Russell |
| 5,592,020 A | 1/1997 | Nakao et al. |
| 5,612,259 A | 3/1997 | Okutomo et al. |
| 5,637,915 A | 6/1997 | Sato et al. |
| 5,696,665 A | 12/1997 | Nagy |
| 5,717,246 A * | 2/1998 | Brooks et al. |
| 5,726,860 A | 3/1998 | Mozdzen |
| 5,751,057 A * | 5/1998 | Palagonia |
| 5,780,925 A | 7/1998 | Cipolla et al. |
| 5,789,808 A | 8/1998 | Yamasaki et al. |
| 5,804,870 A | 9/1998 | Burns |
| 5,804,871 A | 9/1998 | Maeda |
| 5,843,809 A | 12/1998 | Rostoker |
| 5,903,050 A | 5/1999 | Thurairajaratnam et al. |
| 5,903,443 A | 5/1999 | Schoenfeld et al. |
| 5,907,769 A | 5/1999 | Corisis | design
INNER-DIGITIZED BOND FINGERS ON BUS BARS OF SEMICONDUCTOR DEVICE PACKAGE

CROSS REFERENCE TO RELATED APPLICATION

This application is a divisional of application Ser. No. 08/980,151, filed Nov. 26, 1997, now issued as U.S. Pat. No. 6,144,089.

BACKGROUND OF THE INVENTION

1. Field of the Invention

The present invention relates to semiconductor device packages. More particularly, the present invention relates to inner-digitized bond fingers on bus bars of lead frames in semiconductor device packages.

2. State of the Art

The advancement of microprocessing technology has resulted in decreases in the physical dimensions of semiconductor devices such as integrated circuit dies or chips. Such dimensional decreases require coresponding decreases in the dimensions of semiconductor device packages, including a reduction in the size of lead frames and leads used in such packages.

In many semiconductor devices, a lead called a "bus bar" is used to distribute operating voltages to several contact areas on the semiconductor device, and to provide a ground bus to individual contact areas. For example, a bus bar can serve as an inner lead for providing a power supply voltage (Vcc) and a reference voltage (Vss) or a ground to the semiconductor chip. The bus bar can be connected to any point on the chip by short distance wire bonding to supply a voltage. This allows the bus bar to be effectively employed to reduce noise and increase processing speed.

Semiconductor device packages having a lead-on-chip structure have been developed to meet the demand that packaging for chips be smaller and thinner. A bus bar is used in a lead-on-chip structure to accommodate a number of wires in a limited space, and the bus bar is positioned on the chip.

A packaged semiconductor device is disclosed in U.S. Pat. No. 5,229,329 to Chai et al., in which a lead-on-chip lead frame having a first array and a second array of opposing lead fingers is utilized in the device. A pair of power supply bus bars lies between the opposing lead fingers, with an insulator covering the face of the bus bars.

In another lead-on-chip semiconductor device disclosed in U.S. Pat. No. 5,532,189 to Kiyono, recessed bus bar regions are provided in an elongated bus bar to accommodate location of bonding wires which couple the chip pads and associated inner leads. Fillets are formed of insulative adhesive material up about the bus bar region sides to thereby engage the bonding wires to prevent contact between the wires and the bus bar.

In conventional lead-on-chip semiconductor device packages with a bus bar, the bonding wires attached to leads and the chip are required to jump over the bus bar, resulting in a relatively higher wire loop and longer wire. Adjacent bonding wires attached to the bus bar and the chip have a relatively shorter wire loop height and length. Thus, the respective bonding wires attached to the bus bars and to the leads have different loop heights and lengths, resulting in more complexity in manufacturing the device.

In U.S. Pat. No. 5,592,020 to Nakao et al., a conventional semiconductor device package (not lead-on-chip) is disclosed in which a chip is mounted on a bed of a lead frame, and leads such as a pair of bus bars have alternating offset projections off the chip. In one embodiment, an elongated portion of one of the bus bars, excluding the projections on the bus bar, is pushed downward away from bonding wires attached to the chip. While the alternating offset projections on the bus bars provide for more uniformity in wire length in this conventional package, the wire lengths are still relatively longer, since the bus bars have to be spread out off the chip to form the offset projections, thereby reducing the speed of the chip.

Accordingly, there is a need for improved bus bar structures that overcome or avoid the above problems in semiconductor devices.

SUMMARY OF THE INVENTION

The present invention is directed to a semiconductor device package such as a lead-over-chip (LOC) integrated circuit package in which at least one pair of bus bar structures on a lead frame in the device has inner-digitized bond fingers for wire bonding to a semiconductor die or chip. The inner-digitized bond fingers provide for substantial uniformity in wire loop height and length for bond wires attached to the bus bars and the chip. This allows for easier manufacture and inspection of an LOC semiconductor device.

In one aspect of the invention, a semiconductor device package includes a lead frame with a plurality of lead members positioned in an array on a first plane along a vertical axis of the lead frame and a semiconductor die secured to the lead frame. At least one pair of bus bars is connected to the lead frame and positioned over the semiconductor die, with a portion of the bus bars positioned over the semiconductor die including a plurality of inner-digitized bond fingers. The inner-digitized bond fingers are formed from a series of alternating projections and recesses on each bus bar. A first plurality of connection members such as bond wires electrically couples the lead members to the semiconductor die. A second plurality of connection members electrically couples the inner-digitized bond fingers of the bus bars to the semiconductor die. The second plurality of connection members preferably has a substantially uniform loop height and length.

An encapsulating material is formed around the semiconductor die, the bus bars, the connection members, and an inner portion of the lead frame to provide a protective covering for the semiconductor device. The portions of the bus bars over the semiconductor die can be offset along the vertical axis from an outer surface of the semiconductor die, or the portions of the bus bars over the semiconductor die can be adjoined to the outer surface of the semiconductor die.

In one preferred embodiment, a semiconductor device package according to the present invention having a lead-over-chip structure includes a lead frame with a plurality of lead fingers positioned in an array. A semiconductor die is secured to the lead frame, with the semiconductor die including first and second pluralities of bond pads. A first bus bar operatively connected to the lead frame traverses over the semiconductor die and includes a plurality of alternating projections and recesses. A second bus bar operatively connected to the lead frame traverses over the semiconductor die adjacent the first bus bar, with the second bus bar also including a plurality of alternating projections and recesses. Each of the projections of the second bus bar extends into a corresponding one of the recesses of the first bus bar, while each of the projections of the first bus bar extends into a corresponding one of the recesses of the second bus bar, thereby forming inner-digitized bond fingers. A first plurality of bond wires electrically couples the first bus bar to the semiconductor die, with each of the first plurality of bond wires being connected to one of the projections of the first bus bar and one of the first plurality of bond pads on the semiconductor die. A second plurality of bond wires electrically couples the second bus bar to the semiconductor die, with each of the second plurality of bond wires traversing the first bus bar to be connected to one of the projections of the second bus bar and one of the second plurality of bond pads on the semiconductor die.

The present invention provides many advantages and benefits in forming a semiconductor device package. The inner-digitized bond fingers on the bus bars in the present invention result in a reduced number of wire groups having different looping parameters, since there is consistency in the wire trajectory and loop height and length of bond wires attached to the bus bars over the die. This allows the wire bonding program to be simpler with respect to set-up and operation, allows line production to run smoother, and provides increased performance to the chip. In addition, production line yield at the wire bond is improved because the bonding target zones on the inner-digitized bond fingers are all at a similar distance from the bond pads. The present invention also provides improved production line yield during encapsulation of a semiconductor device.

In another aspect of the invention, a method for fabricating a semiconductor device package includes forming a lead frame with a plurality of lead members such as lead fingers positioned in an array on a first plane along a vertical axis of the lead frame. At least one pair of bus bars is formed on the lead frame, with a portion of the bus bars including a plurality of inner-digitized bond fingers. A semiconductor die is secured to the lead frame such that the pair of bus bars is positioned over the semiconductor die. A first plurality of bond wires is attached to the semiconductor die and the lead members. A second plurality of bond wires is attached to the semiconductor die and the inner-digitized bond fingers of the bus bars, such that the second plurality of bond wires has a substantially uniform loop height and length. The above components are then encapsulated with a protective material.

Other aspects and features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order to understand the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

The present invention is directed to a semiconductor device package such as a lead-over-chip integrated circuit package in which at least one pair of bus bar structures on a lead frame in the device has inner-digitized bond fingers for wire bonding to a semiconductor die or chip. The term "inner-digitized" as used herein in conjunction with bond fingers on a pair of bus bars means that the bond fingers on each bus bar form alternating offset projections defining adjacent recesses that accept corresponding projections from the other bus bar to form at least one interlaced bond finger region along the pair of bus bars. The inner digitized bond fingers on the bus bars of the present invention enhance wire bonding performance and throughput during manufacture of a semiconductor device. The bus bars are connected to lead fingers that extend off the chip.

Figure 1:
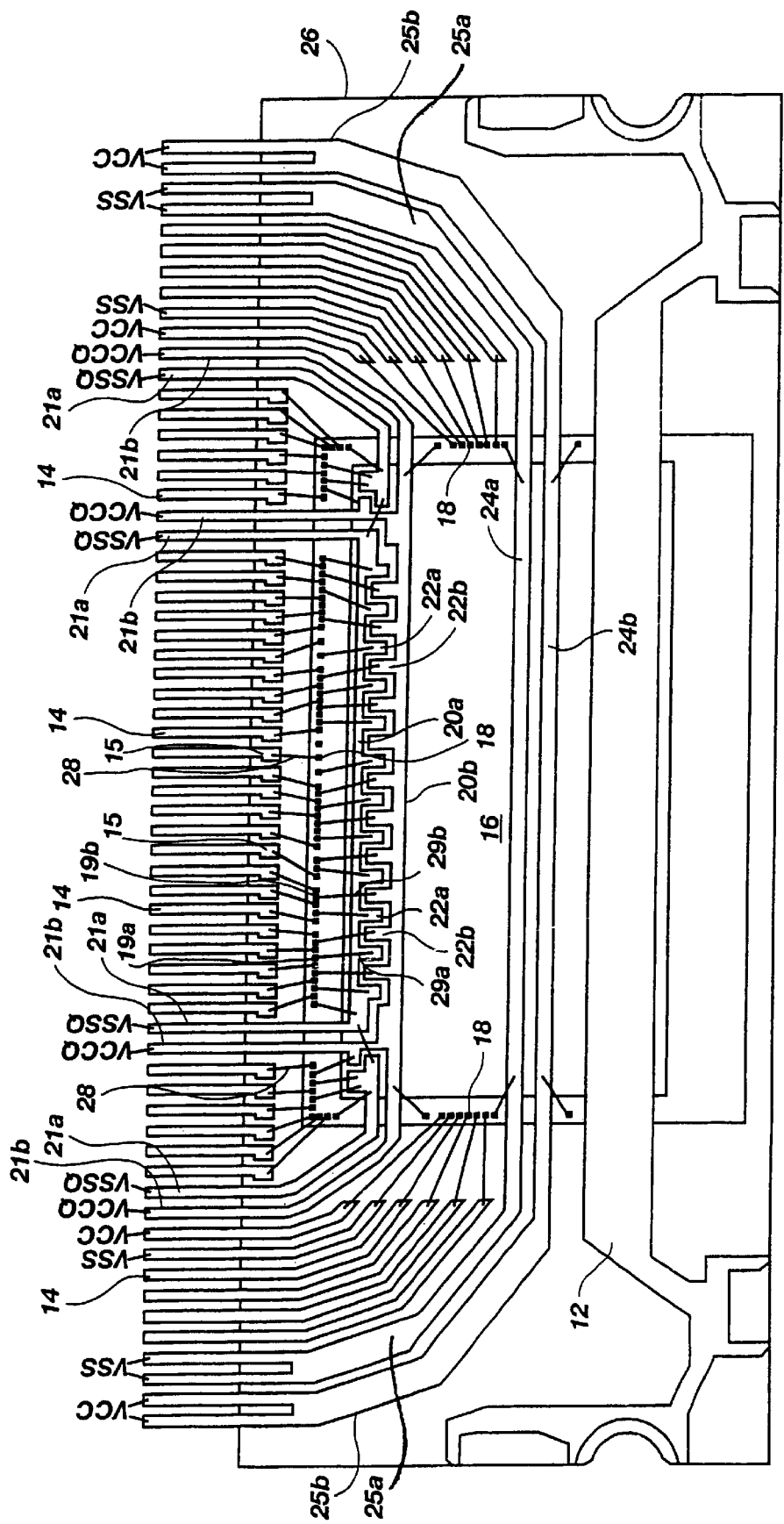
FIG. 1 is a plan view of a semiconductor device package according to one embodiment of the present invention.

Referring to FIG. 1, a semiconductor device package 10 according to one embodiment of the present invention is depicted. The package 10 has a lead-over-chip (LOC) structure and includes a lead frame 12 formed of a conductive metal. The lead frame 12 has a plurality of external connections in the form of lead members or fingers 14, which later serve as pins for connecting the semiconductor device.

An integrated circuit semiconductor chip or die 16 is secured to lead frame 12 by a conventional attaching means such as a suitable adhesive. The semiconductor die 16 can be any integrated circuit device. The semiconductor die 16 has a plurality of interconnection pads on an active surface thereof such as bond pads 18, 19a and 19b, which are disposed along the outer edges of semiconductor die 16 along three sides. The bond pads are configured for electrical connection to lead fingers 14 and to bus bars by connection members such as bond wires, as discussed in more detail below.

A first pair of bus bars 20a and 20b traverses over semiconductor die 16 and is electrically connected respectively to lead fingers 21a and 21b that come off semiconductor die 16. The bus bars are formed as part of the lead frame conductive material and provide ground voltage (Vss) or positive voltage (Vcc) to semiconductor die 16. As shown in FIG. 1, a low potential Vss (e.g., ground potential) is applied to lead fingers 21a connected to bus bar 20a, while a high potential Vcc is applied to lead fingers 21b connected to bus bar 20b.

Portions of bus bars 20a and 20b traversing over semiconductor die 16 include a plurality of inner-digitized bond fingers 22a and 22b formed by a series of alternating recesses and projections on each of bus bars 20a and 20b. The projections and recesses forming the bond fingers 22a on bus bar 20a engage respectively with the recesses and projections forming bond fingers 22b on bus bar 20b as shown in FIG. 1. Thus, each of the projections of bus bar 20a extends into a corresponding one of the recesses of bus bar 20b, and each of the projections of bus bar 20b extends into a corresponding one of the recesses of bus bar 20a. The bond fingers 22a and 22b of bus bars 20a and 20b include bonding zones thereon for attachment of bond wires as discussed below. The inner-digitized configuration of bond fingers 22a and 22b allows the bond wire lengths to be substantially uniform for both of bus bars 20a and 20b.

The portions of bus bars 20a and 20b positioned over semiconductor die 16 can be offset such as by being upset along a vertical or z-axis from an outer surface of semiconductor die 16. Changing the z-axis height of the bus bars balances out the flow of the molding compound during encapsulation of the device. As shown in FIG. 1, each of bus bars 20a and 20b is connected to four separate leads in the form of lead fingers 21a and 21b, respectively. This adds strength to the lead frame structure, which is important during encapsulation of the device with a molding compound. Alternatively, the portions of bus bars 20a and 20b over semiconductor die 16 can be adjoined to the outer surface of semiconductor die 16, with an appropriate insulation material (not shown) used therebetween.

FIG. 1 also depicts a second pair of bus bars 24a and 24b that traverses across semiconductor die 16. The bus bars 24a and 24b do not have inner digitized bond fingers. Leads at opposite ends of package 10 in the form of lead fingers 25a and 25b are attached to each end of bus bars 24a and 24b, providing added strength to the bus bar structures.

An encapsulating material 26 such as a molding compound of a plastic material is formed around the semiconductor die, the bus bars, the bond wires, and an inner portion of the lead frame to provide a protective covering such as a plastic body for these components. A molding compound such as a plastic epoxy can be utilized as the encapsulating material. Low stress molding techniques known to those skilled in the art are used in encapsulating the device. With the bus bars running across the semiconductor die, it is important to anchor down the bus bars at both ends so the bus bars do not move around during encapsulation with a molding compound.

The portions of lead fingers 14 disposed in encapsulating material 26 are referred to as "inner leads," while the portions of lead fingers 14 that extend out of material 26 are referred to as "outer leads." The outer leads extending outside of material 26 later serve as external pins for connecting the semiconductor device.

Each inner lead portion of lead fingers 14 is provided with a bonding area 15 where a bond wire is to be attached. It is preferred, where possible, that the width of the inner lead at bonding area 15 be wider than the other portion of a lead finger 14 to ensure proper wire bonding.

A conventional wire bonding process can be used to couple various bond wires to the semiconductor die and to the lead fingers and bus bars. For example, one end of a bond wire is connected to a bond pad on the semiconductor die, while the other end of the bond wire is attached to the bonding area of a lead finger. Other bond wires are connected to different bond pads and to bonding zones on the bus bars.

As shown in FIG. 1, a first plurality of bond wires 28 electrically couples lead fingers 14 to a first plurality of bond pads 18 of semiconductor die 16. For example, one end of a bond wire 28 is attached to a lead finger 14 at bonding area 15 and the other end of bond wire 28 is attached to a corresponding bond pad 18 along the edge of semiconductor die 16.

A plurality of bond wires 29a and 29b electrically couples the bond fingers 22a and 22b of bus bars 20a and 20b to a plurality of selected bond pads 19a and 19b on semiconductor die 16. For example, one end of a bond wire 29a is connected to a corresponding bond pad 19a. The other end of bond wire 29a is connected to a bonding zone of a bond finger 22a of bus bar 20a. The bond wires 29b are connected in a similar manner to bond pads 19b and to bonding zones on bond fingers 22b of bus bar 20b. Multiple bond wire contacts are made to the bus bars to more efficiently distribute voltage to the chip.

In forming the semiconductor device package of the invention, it is important that the bonding zones on the bond fingers of the bus bars be as close to directly in front of a corresponding bond pad on the semiconductor die as possible. It is also important that adjacent bond wires not touch each other in order to prevent shorting. In one preferred encoding the trajectories of the bond wires attached between the bond pads and the bond fingers are about 30° or less with respect to a line perpendicular to the edge of the die adjacent to the bond pads. Thus, a bond wire trajectory of 0° would be perpendicular to the edge of the die. The trajectory angle can be greater as long as the trajectory of a particular bond wire does not interfere with another bond wire.

Figure 2:
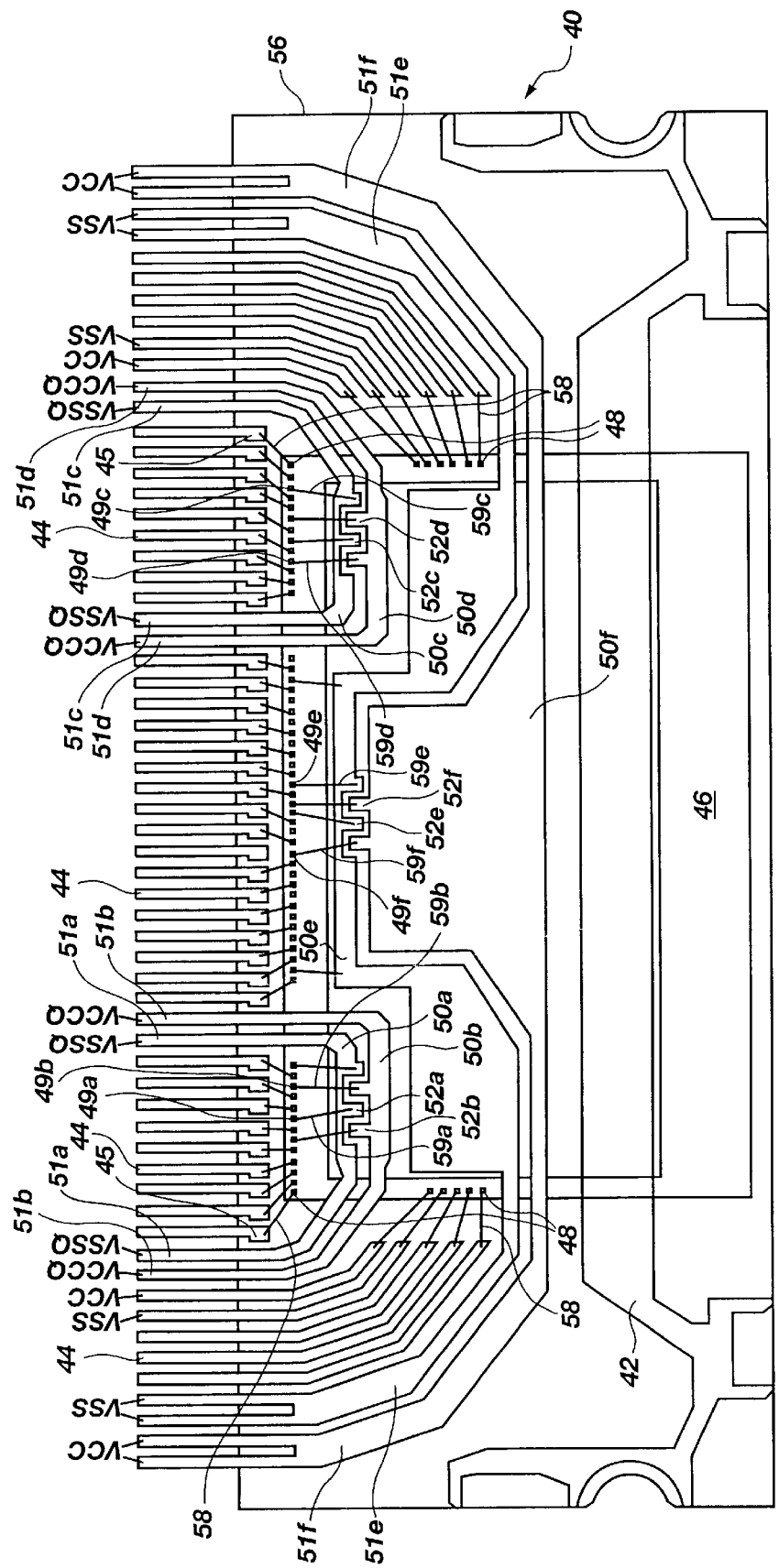
FIG. 2 is a plan view of a semiconductor device package according to another embodiment of the invention.

Referring to FIG. 2, a semiconductor device package 40 according to another embodiment of the present invention is depicted. The package 40 has a lead-over-chip structure and includes a lead frame 42 with a plurality of lead fingers 44. A semiconductor die 46 is secured to lead frame 42 by a conventional attaching means. The semiconductor die 46 has a plurality of bond pads 48 and 49a–49f disposed along the outer edges of three sides thereof. The bond pads are configured for electrical connection to lead fingers 44 and to bus bars by bond wires, as discussed in more detail below.

Three pairs of bus bars traverse over various portions of semiconductor die 46 as shown in FIG. 2. A first pair of bus bars 50a and 50b traverses over a portion of semiconductor die 46 at one end thereof and is connected respectively to lead fingers 51a and 51b that come off semiconductor die 46. A second pair of bus bars 50c and 50d traverses over a portion of semiconductor die 46 at the opposite end thereof from bus bars 50a and 50b, and is connected respectively to lead fingers 5c and 51d. A third pair of bus bars 50e and 50f traverses over the entire length of semiconductor die 46 and is connected respectively to lead fingers 51e and 51f disposed at opposite ends of lead frame 42. As illustrated in FIG. 2, a low potential Vss (e.g., ground potential) is applied to lead fingers 51a, 51c and 51e connected to bus bars 50a, 50c and 50e, while a high potential Vcc is applied to lead fingers 51b, 51d and 51f connected to bus bars 50b, 50d and 50f.

The portions of the bus bar pairs traversing over semiconductor die 46 include a plurality of inner-digitized bond fingers formed by a series of alternating recesses and projections on each bus bar. For example, projections and recesses form bond fingers 52a on bus bar 50a, which engage respectively with recesses and projections forming bond fingers 52b on bus bar 50b as shown in FIG. 2. Projections and recesses also form bond fingers 52c on bus bar 50c, which engage respectively with recesses and projections forming bond fingers 52d on bus bar 50d. In addition, projections and recesses also form bond fingers 52e on bus bar 50e, which engage respectively with recesses and projections forming bond fingers 52f on bus bar 50f. The bond fingers of the bus bars include bonding zones thereon for attachment of bond wires as discussed below.

The portions of the bus bars positioned over semiconductor die 46 can be offset such as by being upset along a vertical or z-axis from an outer surface of semiconductor die 46. Alternatively, the portions of the bus bars over semiconductor die 46 can be adjoined to the outer surface of semiconductor die 46, with an appropriate insulation material (not shown) used therebetween.

An encapsulating material 56 such as a molding compound of a plastic material is formed around the semiconductor die, the bus bars, the bond wires, and an inner portion of the lead frame to provide a protective covering for these components in the embodiment of FIG. 2. The outer leads extending outside of material 56 later serve as external pins for connecting the semiconductor device. Each inner lead portion of lead fingers 44 is provided with a bonding area 45 where a bond wire is to be attached. It is preferred, where possible, that the width of the inner lead at bonding area 45 be wider than the other portion of a lead finger 44 to ensure proper wire bonding.

As shown in FIG. 2, a first plurality of bond wires 58 electrically couples lead fingers 44 to a first plurality of bond pads 48 of semiconductor die 46. For example, one end of a bond wire 58 is attached to a lead finger 44 at bonding area 45 and the other end of bond wire 58 is attached to a corresponding bond pad 48 along the edge of semiconductor die 46.

A plurality of other bond wires electrically couples the bond fingers of the bus bars to a plurality of selected bond pads on semiconductor die 46. For example, one end of a bond wire 59a is connected to a corresponding bond pad 49a. The other end of bond wire 59a is connected to a bonding zone of bond finger 52a of bus bar 50a. The bond wires 59b are connected in a similar manner to bond pads 49b and bonding zones on bond fingers 52b of bus bar 50b. Additional bond wires 59c, 59d, 59e and 59f connect bus bars 50c, 50d, 50e and 50f to selected bond pads 49c, 49d, 49e and 49f on semiconductor die 46 as depicted in FIG. 2.

The above-described embodiments of the invention utilize a hybrid lead frame in which some leads are off the semiconductor die, and some leads attached to bus bars are over the die. With the bus bars placed over the die, the whole area of the die can be utilized. This allows leads to not be crowded so it is possible to inner-digitize the bus bars over the die. All of the bond wires that are on the die can have one wire group set of parameters and all the wires that are off the die can have a different wire group set of parameters, thereby more easily facilitating manufacture of the semiconductor device. For example, the leads that are off the die can have bonding areas that are lower than the bond pads on the semiconductor die. Thus, the bond wires attached to leads off the die are going to have different parameters than bond wires attached to the bus bars over the die.

The present invention provides for general uniformity in the trajectory of bond wires in a group, which means that every wire in a particular group has the same or similar loop height and length. The loop height is defined as the vertical distance from the surface of the die to the highest point of the wire. The loop length is the distance the wire travels from a bond pad on the semiconductor die to a bonding zone on a bus bar or a lead finger. The present invention allows consistent loop shapes and lengths within a particular wire group, as well as fewer wire groups.

Although the present invention has been described with respect to lead-over-chip assemblies, the present invention can also be applied to conventional semiconductor packages in which bus bars are being jumped over by bond wires.

In a method for fabricating a semiconductor device package according to the present invention, a lead frame is formed with a plurality of lead fingers positioned in an array on a first plane along a vertical axis of the lead frame. At least one pair of bus bars is formed on the lead frame, with a portion of the bus bars including a plurality of inner-digitized bond fingers. A semiconductor die having first and second pluralities of bond pads thereon is secured to the lead frame such that the pair of bus bars is positioned over the semiconductor die. A first plurality of bond wires is attached to the first plurality of bond pads on the semiconductor die and to the lead fingers. A second plurality of bond wires is attached to the second plurality of bond pads on the semiconductor die and to the inner-digitized bond fingers of the bus bars, such that the second plurality of bond wires has a substantially uniform loop height and length. The above components including the semiconductor die, the bus bars, the first and second pluralities of bond wires, and an inner portion of the lead frame are then encapsulated with a protective material such as an epoxy material.

In a method for producing a lead frame for use in a semiconductor device package having a lead-over-chip structure according to the present invention, a plurality of lead fingers is formed in an array on a first plane along a vertical axis of the lead frame. A first bus bar is formed with a plurality of alternating projections and recesses and is configured to traverse over a semiconductor die. A second bus bar is formed adjacent to the first bus bar, with the second bus bar also including a plurality of alternating projections and recesses. In the assembled lead frame, each of the projections of the second bus bar extends into a corresponding one of the recesses of the first bus bar and each of the projections of the first bus bar extends into a corresponding one of the recesses of the second bus bar.

The present invention provides many advantages and benefits in forming a semiconductor device package over prior technology. The inner-digitized bond fingers on the bus bars in the present invention result in a reduced number of wire groups having different looping parameters, since there is consistency in the wire trajectory and loop height and length of bond wires attached to the bus bars over the die. This allows the wire bonding program to be simpler with respect to set-up and operation, allows line production to run smoother, and provides increased performance to the chip. Otherwise, if there is a varying degree of wire loop trajectories and loop heights such as in the prior art, it is more difficult for the wire bonding program to be set-up and operated.

In addition, production line yield at the wire bond is improved because the bonding target zones on the inner-digitized bond fingers are all at a similar distance from the bond pads. The wire bonder machine utilized during production runs smoother if all bond wire lengths are about the same. The present invention also provides improved production line yield during encapsulation of a semiconductor device. By having consistent wire looping, the process window is wider and allows for easier molding because there is more room to move within the process window without affecting the product.

The inner-digitized bond fingers of the bus bars according to the present invention are also advantageous in that by allowing for uniformity of bond wire loops in length, height and trajectory, inspection for defects of a manufactured product is facilitated. A uniform bond wire loop scheme allows for easy detection of a poorly formed loop that may lead to yield reduction if not detected. Consistency and uniformity of the wires allow inspection of a manufactured product to be made more easily, since it is easier to identify a bad or sagging wire if one exists in relation to a uniform group of wires. Such inspection can be by individual visual inspection or by an optical device that recognizes differences in placement of the wires.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of fabricating a lead frame, comprising:

forming a plurality of lead fingers, each lead finger of said plurality of lead fingers including a bond area configured for electrical connection to a bond pad on an active surface of an integrated circuit device;

forming a first bus bar including at least an inner-digitized portion configured to traverse said active surface of said integrated circuit device, said inner digitized portion including a plurality of alternating projections and recesses;

forming a second bus bar including at least an inner-digitized portion configured to traverse said active surface of said integrated circuit device, said inner-digitized portion including a plurality of alternating projections and recesses, each projection of said plurality of alternating projections and recesses on said first bus bar extending into one recess of said plurality of alternating projections and recesses on said second bus bar and terminating at an end configured for electrical connection to a bond pad on said active surface of said integrated circuit device, each projection of said plurality of alternating projections and recesses on said second bus bar extending into one recess of said plurality of alternating projections and recesses on said first bus bar and terminating at an end configured for electrical connection to a bond pad on said active surface of said integrated circuit device; and configuring said leadframe to substantially equalize the loop height and length between at least one said end of said first bus bar configured for electrical connection to a bond pad and its associated bond pad and the loop height and length between at least one said end of said second bus bar configured for electrical connection to a bond pad and its associated bond pad.

2. The method of claim 1, further comprising vertically offsetting at least one of said inner-digitized portions of said first and second bus bars from at least one of said plurality of lead fingers.

3. The method of claim 1, further comprising:

forming a third bus bar including at least an inner-digitized portion configured to traverse said active surface of said integrated circuit device, said inner digitized portion including a plurality of alternating projections and recesses; and forming a fourth bus bar including at least an inner-digitized portion configured to traverse said active surface of said integrated circuit device, said inner-digitized portion including a plurality of alternating projections and recesses, each projection of said plurality of alternating projections and recesses on said third bus bar extending into one recess of said plurality of alternating projections and recesses on said fourth bus bar and terminating at an end configured for electrical connection to a bond pad on said active surface of said integrated circuit device, each projection of said plurality of alternating projections and recesses on said fourth bus bar extending into one recess of said plurality of alternating projections and recesses on said third bus bar and terminating at an end configured for electrical connection to a bond pad on said active surface of said integrated circuit device.

4. The method of claim 3, further comprising:

forming a fifth bus bar including at least an inner-digitized portion configured to traverse said active surface of said integrated circuit device, said inner digitized portion including a plurality of alternating projections and recesses; and forming a sixth bus bar including at least an inner-digitized portion configured to traverse said active surface of said integrated circuit device, said inner-digitized portion including a plurality of alternating projections and recesses, each projection of said plurality of alternating projections and recesses on said fifth bus bar extending into one recess of said plurality of alternating projections and recesses on said sixth bus bar and terminating at an end configured for electrical connection to a bond pad on said active surface of said integrated circuit device, each projection of said plurality of alternating projections and recesses on said sixth bus bar extending into one recess of said plurality of alternating projections and recesses on said fifth bus bar and terminating at an end configured for electrical connection to a bond pad on said active surface of said integrated circuit device.

5. The method of claim 1, further comprising forming at least one other bus bar, said at least one other bus bar including at least a transverse portion configured to extend across said active surface of said integrated circuit device and further configured for electrical connection to a bond pad on said active surface of said integrated circuit device.

6. A method of manufacturing a lead frame for electrical connection to a plurality of bond pads on an active surface of a semiconductor die, comprising:

forming a plurality of lead fingers, each lead finger of said plurality of lead fingers including one end configured for electrical connection to one of said bond pads on said semiconductor die and further including a second opposing end configured for electrical connection to an external device;

forming a bus bar pair configured to traverse said active surface of said semiconductor die, said bus bar pair including a first bus bar having opposing ends and a second bus bar having opposing ends, each of said opposing ends of said first and second bus bars forming at least one outer lead finger extending therefrom having at least a portion substantially parallel to said plurality of lead fingers and terminating at an end configured for electrical connection to said external device, said bus bar pair further including a plurality of alternating projections and recesses formed on each of said first and second bus bars, each of said projections on said first bus bar extending into one of said recesses on said second bus bar and each of said projections on said second bus bar extending into one of said recesses on said first bus bar, said each projection on said first and second bus bars terminating at an end configured for electrical connection to one of said bond pads on said semiconductor die;

configuring said projections on said first and second bus bars to substantially equalize the loop height and length between at least one said end of said first bus bar configured for electrical connection to a bond pad and its associated bond pad and the loop height and length between at least one said end of said second bus bar configured for electrical connection to a bond pad and its associated bond pad.

7. The method of claim 6, further comprising vertically offsetting at least a portion of each of said first and second bus bars from at least one of said plurality of lead fingers.

8. The method of claim 6, further comprising forming at least one other bus bar pair configured to traverse said active surface of said semiconductor die, said at least one other bus bar pair including a first other bus bar having opposing ends and a second other bus bar having opposing ends, each of said opposing ends of said first other and second other bus bars forming at least one outer lead finger extending therefrom having at least a portion substantially parallel to said plurality of lead fingers and terminating at an end configured for electrical connection to said external device, said at least one other bus bar pair further including a plurality of alternating projections and recesses formed on each of said first other and second other bus bars, each of said projections on said first other bus bar extending into one of said recesses on said second other bus bar and each of said projections on said second other bus bar extending into one of said recesses on said first other bus bar, said each projection on said first other and second other bus bars terminating at an end configured for electrical connection to one of said bond pads on said semiconductor die.

9. A method of manufacturing a lead frame for attachment to a semiconductor die, said semiconductor die including an active surface and a plurality of bond pads disposed on said active surface adjacent an outer peripheral edge of said semiconductor die, said method comprising:

forming a plurality of lead fingers, each lead finger of said plurality of lead fingers having an end configured to terminate proximate said plurality of bond pads adjacent said outer peripheral edge of said semiconductor die;

forming a first bus bar including at least a transverse portion configured to extend across said active surface of said semiconductor die, said transverse portion having at least two bond fingers and at least one recess therebetween, each bond finger of said at least two bond fingers extending from said transverse portion and having an end configured to terminate proximate said plurality of bond pads on said semiconductor die; and forming a second bus bar including at least a transverse portion configured to extend across said active surface of said semiconductor die, said transverse portion having at least two bond fingers and at least one recess therebetween, each bond finger of said at least two bond fingers extending from said transverse portion and having an end configured to terminate proximate said plurality of bond pads on said semiconductor die, at least one bond finger on said first bus bar extending into said at least one recess on said second bus bar and at least one bond finger on said second bus bar extending into said at least one recess on said first bus bar.

10. The method of claim 9, further comprising vertically offsetting at least said transverse portions of said first and second bus bars from at least one of said plurality of lead fingers.

11. The method of claim 9, further comprising:

forming a third bus bar including at least a transverse portion configured to extend across said active surface of said semiconductor die, said transverse portion having at least two bond fingers and at least one recess therebetween, each bond finger of said at least two bond fingers extending from said transverse portion and having an end configured to terminate proximate said plurality of bond pads on said semiconductor die; and forming a fourth bus bar including at least a transverse portion configured to extend across said active surface of said semiconductor die, said transverse portion having at least two bond fingers and at least one recess therebetween, each bond finger of said at least two bond fingers extending from said transverse portion and having an end configured to terminate proximate said plurality of bond pads on said semiconductor die, at least one bond finger on said third bus bar extending into said at least one recess on said fourth bus bar and at least one bond finger on said fourth bus bar extending into said at least one recess on said third bus bar.

12. The method of claim 9, further comprising forming at least one other bus bar including a transverse portion configured to extend across said active surface of said semiconductor die, said transverse portion further configured for electrical connection to at least one bond pad of said plurality of bond pads on said semiconductor die.

13. A method of fabricating a lead-over-chip lead frame for attachment to a semiconductor die, said semiconductor die including a plurality of bond pads disposed on an active surface thereof and arranged in a row adjacent an edge of said semiconductor die, said method comprising:

forming a plurality of lead fingers, each lead finger of said plurality of lead fingers configured to be orientated substantially perpendicular to said edge of said semiconductor die, said each lead finger further having an outer end configured for electrical connection to an external device and an opposing inner end configured to terminate proximate said edge of said semiconductor device for electrical connection to one bond pad of said plurality of bond pads on said semiconductor die;

forming a first bus bar, said first bus bar including an inner-digitized portion extending between first and second supporting lead fingers, said inner-digitized portion configured to traverse said active surface of said semiconductor die substantially parallel to said row of said bond pads on said semiconductor die, said inner-digitized portion further including a first plurality of bond fingers separated by recesses, said first and second supporting lead fingers each including at least a portion orientated substantially perpendicular to said inner-digitized portion configured to extend off said active surface of said semiconductor die substantially parallel to said plurality of lead fingers and terminating at an outer end configured for electrical connection to said external device; and forming a second bus bar, said second bus bar including an inner-digitized portion extending between first other and second other supporting lead fingers, said inner-digitized portion configured to traverse said active surface of said semiconductor die substantially parallel to said row of said bond pads on said semiconductor die, said inner-digitized portion further including a second plurality of bond fingers separated by recesses, said first other and second other supporting lead fingers each including at least a portion orientated substantially perpendicular to said inner-digitized portion configured to extend off said active surface of said semiconductor die substantially parallel to said plurality of lead fingers and terminating at an outer end configured for electrical connection to said external device;

wherein each bond finger of said first plurality of bond fingers extends towards said inner-digitized portion of said second bus bar into one of said recesses of said inner-digitized portion of said second bus bar, said each bond finger of said first plurality of bond fingers terminating at a bonding target zone configured for electrical connection to one bond pad of said plurality of bond pads on said semiconductor die; and wherein each bond finger of said second plurality of bond fingers extends towards said inner-digitized portion of said first bus bar into one of said recesses of said inner-digitized portion of said first bus bar, said each bond finger of said second plurality of bond fingers terminating at a bonding target zone configured for electrical connection to one bond pad of said plurality of bond pads on said semiconductor die.

14. The method of claim 13, further comprising arranging said bonding target zones on said bond fingers of said first and second bus bars along a substantially straight imaginary line to substantially equidistantly space all said bonding target zones from said row of bond pads on said semiconductor die.

15. The method of claim 13, further comprising vertically offsetting at least one of said inner-digitized portions of said first and second bus bars relative to at least one of said plurality of lead fingers.

16. The method of claim 13, further comprising:
    forming a third bus bar, said third bus bar including an inner-digitized portion extending between first next and second next supporting lead fingers, said inner-digitized portion configured to traverse said active surface of said semiconductor die substantially parallel to said row of said bond pads on said semiconductor die, said inner-digitized portion further including a third plurality of bond fingers separated by recesses, said first next and second next supporting lead fingers each including at least a portion orientated substantially perpendicular to said inner-digitized portion configured to extend off said active surface of said semiconductor die substantially parallel to said plurality of lead fingers and terminating at an outer end configured for electrical connection to said external device; and
    forming a fourth bus bar, said fourth bus bar including an inner-digitized portion extending between first additional and second additional supporting lead fingers, said inner-digitized portion configured to traverse said active surface of said semiconductor die substantially parallel to said row of said bond pads on said semiconductor die, said inner-digitized portion further including a fourth plurality of bond fingers separated by recesses, said first additional and second additional supporting lead fingers each including at least a portion orientated substantially perpendicular to said inner-digitized portion configured to extend off said active surface of said semiconductor die substantially parallel to said plurality of lead fingers and terminating at an outer end configured for electrical connection to said external device;
    wherein each bond finger of said third plurality of bond fingers extends towards said inner-digitized portion of said fourth bus bar into one of said recesses of said inner-digitized portion of said fourth bus bar, said each bond finger of said third plurality of bond fingers terminating at a bonding target zone configured for electrical connection to one bond pad of said plurality of bond pads on said semiconductor die; and
    wherein each bond finger of said fourth plurality of bond fingers extends towards said inner-digitized portion of said third bus bar into one of said recesses of said inner-digitized portion of said third bus bar, said each bond finger of said fourth plurality of bond fingers terminating at a bonding target zone configured for electrical connection to one bond pad of said plurality of bond pads on said semiconductor die.

17. The method of claim 13, further comprising forming at least one other bus bar, said at least one other bus bar including a transverse portion extending between first next and second next supporting lead fingers, said transverse portion configured to extend across said active surface of said semiconductor die and for electrical connection to at least one bond pad of said plurality of bond pads on said semiconductor die, said first next and second next supporting lead fingers each including at least a portion orientated substantially perpendicular to said transverse portion configured to extend off said active surface of said semiconductor die substantially parallel to said plurality of lead fingers and terminating at an outer end configured for electrical connection to said external device.

18. A method of fabricating a lead-over-chip lead frame for assembly into an integrated circuit package, said integrated circuit package including a semiconductor die having a plurality of bond pads on an active surface thereof, comprising:
    forming a plurality of lead fingers, each lead finger of said plurality of lead fingers having one end configured for electrical connection to an external device and an opposing end configured for electrical connection to at least one bond pad of said plurality of bond pads on said semiconductor die;
    forming a first bus bar including a transverse portion having opposing ends, said transverse portion configured to extend across said active surface of said semiconductor die, each of said opposing ends forming an outer lead finger extending therefrom having at least a portion substantially parallel to said plurality of lead fingers and terminating at an end configured for electrical connection to said external device;
    forming a second bus bar including a transverse portion having opposing ends, said transverse portion configured to extend across said active surface of said semiconductor die, each of said opposing ends forming an outer lead finger extending therefrom having at least a portion substantially parallel to said plurality of lead fingers and terminating at an end configured for electrical connection to said external device, said transverse portion of said second bus bar substantially parallel to said transverse portion of said first bus bar;
    forming a first plurality of alternating bond fingers and recesses on said transverse portion of said first bus bar, each bond finger of said first plurality of alternating bond fingers and recesses extending towards said transverse portion of said second bus bar and terminating at an end configured for electrical connection to at least one bond pad of said plurality of bond pads on said semiconductor die; and
    forming a second plurality of alternating bond fingers and recesses on said transverse portion of said second bus bar, each bond finger of said second plurality of alternating bond fingers and recesses extending towards said transverse portion of said first bus bar and terminating at an end configured for electrical connection to at least one bond pad of said plurality of bond pads on said semiconductor die;
    wherein at least one bond finger of said first plurality of alternating bond fingers and recesses extends into one recess of said second plurality of alternating bond fingers and recesses and at least one bond finger of said second plurality of alternating bond fingers and recesses extends into one recess of said first plurality of alternating bond fingers and recesses; and
    wherein said bond fingers on said first and second bus bars are configured to substantially equalize the loop height and length between at least one said end of said bond finger of said first bus bar configured for electrical connection to a bond pad and its associated bond pad and the loop height and length between at least one said end of said bond finger of said second bus bar configured for electrical connection to a bond pad and its associated bond pad.

19. The method of claim 18, further comprising:

forming a third bus bar including a transverse portion having opposing ends, said transverse portion configured to extend across said active surface of said semiconductor die, each of said opposing ends forming an outer lead finger extending therefrom having at least a portion substantially parallel to said plurality of lead fingers and terminating at an end configured for electrical connection to said external device;

forming a fourth bus bar including a transverse portion having opposing ends, said transverse portion configured to extend across said active surface of said semiconductor die, each of said opposing ends forming an outer lead finger extending therefrom having at least a portion substantially parallel to said plurality of lead fingers and terminating at an end configured for electrical connection to said external device, said transverse portion of said fourth bus bar substantially parallel to said transverse portion of said third bus bar;

forming a third plurality of alternating bond fingers and recesses on said transverse portion of said third bus bar, each bond finger of said third plurality of alternating bond fingers and recesses extending towards said transverse portion of said fourth bus bar and terminating at an end configured for electrical connection to at least one bond pad of said plurality of bond pads on said semiconductor die;

forming a fourth plurality of alternating bond fingers and recesses on said transverse portion of said fourth bus bar, each bond finger of said fourth plurality of alternating bond fingers and recesses extending towards said transverse portion of said third bus bar and terminating at an end configured for electrical connection to at least one bond pad of said plurality of bond pads on said semiconductor die; and wherein at least one bond finger of said third plurality of alternating bond fingers and recesses extends into one recess of said fourth plurality of alternating bond fingers and recesses and at least one bond finger of said fourth plurality of alternating bond fingers and recesses extends into one recess of said third plurality of alternating bond fingers and recesses.

20. The method of claim 18, further comprising forming at least one other bus bar including a transverse portion extending between a pair of outer lead fingers, said transverse portion configured for electrical connection to at least one bond pad of said plurality of bond pads on said semiconductor die, each lead finger of said pair of outer lead fingers having at least a portion substantially parallel to said plurality of lead fingers and terminating at an end configured for electrical connection to said external device.

21. The method of claim 18, further comprising vertically offsetting at least said transverse portion of said first bus bar and at least said transverse portion of said second bus bar relative to at least one of said plurality of lead fingers.

22. The method of claim 18, further comprising forming at least one other outer lead finger extending from at least one of said opposing ends of at least one of said first and second bus bars, said at least one other outer lead finger having at least a portion substantially parallel to said plurality of lead fingers and terminating at an end configured for electrical connection to said external device.

23. A method of manufacturing an integrated circuit device package, comprising:

providing an integrated circuit device including a plurality of bond pads disposed on an active surface thereof;

forming a plurality of lead fingers, each lead finger of said plurality of lead fingers including one end configured for electrical connection to one bond pad of said plurality of bond pads on said integrated circuit device and further including a second opposing end configured for electrical connection to an external device;

forming a bus bar pair, said bus bar pair including a first bus bar having opposing ends and a second bus bar having opposing ends, each of said opposing ends of said first and second bus bars forming at least one outer lead finger extending therefrom having at least a portion substantially parallel to said plurality of lead fingers and terminating at an end configured for electrical connection to said external device, said bus bar pair further including a plurality of alternating projections and recesses formed on each of said first and second bus bars, each of said projections on said first bus bar extending into one of said recesses on said second bus bar and each of said projections on said second bus bar extending into one of said recesses on said first bus bar, said each projection on said first and second bus bars terminating at an end configured for electrical connection to one bond pad of said plurality of bond pads on said integrated circuit device, said plurality of lead fingers and said bus bar pair comprising a lead frame;

configuring said bus bar pair to substantially equalize the loop height and length between at least one said end of said projections on said first bus bar configured for electrical connection to a bond pad and its associated bond pad and the loop height and length between at least one said end of said projections on said second bus bar configured for electrical connection to a bond pad and its associated bond pad;

securing said integrated circuit package to said lead frame, at least a portion of said bus bar pair of said lead frame traversing said active surface of said integrated circuit device;

electrically connecting said one end of at least one of said lead fingers of said plurality of lead fingers to one bond pad of said plurality of bond pads on said integrated circuit device;

electrically connecting at least one of said projections on said first bus bar to one bond pad of said plurality of bond pads on said integrated circuit device; and electrically connecting at least one of said projections on said second bus bar to one bond pad of said plurality of bond pads on said integrated circuit device.

24. The method of claim 23, further comprising encapsulating said integrated circuit device and a portion of said lead frame with an encapsulant material, said opposing end of each said lead finger of said plurality of lead fingers extending from said encapsulant material, said end of each said outer lead finger of said first and second bus bars extending from said encapsulant material.

25. The method of claim 23, further comprising vertically offsetting at least a portion of each of said first and second bus bars from said plurality of lead fingers.

26. The method of claim 23, further comprising:

forming at least one other bus bar pair, said at least one other bus bar pair including a first bus bar having opposing ends and a second bus bar having opposing ends, each of said opposing ends of said first and second bus bars forming at least one outer lead finger extending therefrom having at least a portion substantially parallel to said plurality of lead fingers and terminating at an end configured for electrical connection to said external device, said at least one other bus bar pair further including a plurality of alternating projections and recesses formed on each of said first and second bus bars, each of said projections on said first bus bar extending into one of said recesses on said second bus bar and each of said projections on said second bus bar extending into one of said recesses on said first bus bar, said each projection of said first and second bus bars terminating at an end configured for electrical connection to one of said bond pads on said integrated circuit device;

wherein said plurality of lead fingers, said bus bar pair, and said at least one other bus bar pair comprise said lead frame secured to said integrated circuit device, at least a portion of said at least one other bus bar pair traversing said active surface of said integrated circuit device;

electrically connecting at least one of said projections on said first bus bar of said at least one other bus bar pair to one bond pad of said plurality of bond pads on said integrated circuit device; and electrically connecting at least one of said projections on said second bus bar of said at least one other bus bar pair to one bond pad of said plurality of bond pads on said integrated circuit device.

27. A method of manufacturing a semiconductor device package, comprising:

providing a semiconductor die having a plurality of bond pads on an active surface thereof, said plurality of bond pads disposed adjacent an outer peripheral edge of said semiconductor die;

fabricating a lead frame comprising:
  forming a plurality of lead fingers, each lead finger of said plurality of lead fingers having an end configured to terminate proximate said outer peripheral edge of said semiconductor die;
  forming a first bus bar including at least a transverse portion, said transverse portion having at least two bond fingers and at least one recess therebetween, each bond finger of said at least two bond fingers extending from said transverse portion and having an end configured to terminate proximate said plurality of bond pads on said semiconductor die;
  forming a second bus bar including at least a transverse portion, said transverse portion having at least two bond fingers and at least one recess therebetween, each bond finger of said at least two bond fingers extending from said transverse portion and having an end configured to terminate proximate said plurality of bond pads on said semiconductor die, at least one bond finger on said first bus bar extending into said at least one recess on said second bus bar and at least one bond finger on said second bus bar extending into said at least one recess on said first bus bar;

securing said lead frame to said active surface of said semiconductor die, said transverse portions of said first and second bus bars extending across said active surface of said semiconductor die;

electrically connecting said end of at least one lead finger of said plurality of lead fingers to one bond pad of said plurality of bond pads;

attaching one end of a first bond wire to one bond pad of said plurality of bond pads and attaching an opposing end of said first bond wire to one bond finger of said at least two bond fingers on said first bus bar to electrically couple said one bond finger on said first bus bar to said one bond pad; and attaching one end of a second bond wire to one bond pad of said plurality of bond pads and attaching an opposing end of said second bond wire to one bond finger of said at least two bond fingers on said second bus bar to electrically couple said one bond finger on said second bus bar to said one bond pad.

28. The method of claim 27, wherein a length of said first bond wire is substantially the same as a length of said second bond wire and a loop height of said first bond wire is substantially the same as a loop height of said second bond wire.

29. The method of claim 27, further comprising encapsulating said semiconductor die and a portion of said lead frame in an encapsulant material.

30. The method of claim 27, further comprising vertically offsetting at least said transverse portions of said first and second bus bars from said active surface of said semiconductor die.

31. The method of claim 27, further comprising:

forming a third bus bar on said lead frame including at least a transverse portion, said transverse portion having at least two bond fingers and at least one recess therebetween, each bond finger of said at least two bond fingers extending from said transverse portion and having an end configured to terminate proximate said plurality of bond pads on said semiconductor die;

forming a fourth bus bar on said lead frame including at least a transverse portion, said transverse portion having at least two bond fingers and at least one recess therebetween, each bond finger of said at least two bond fingers extending from said transverse portion and having an end configured to terminate proximate said plurality of bond pads on said semiconductor die, at least one bond finger on said third bus bar extending into said at least one recess on said fourth bus bar and at least one bond finger on said fourth bus bar extending into said at least one recess on said third bus bar;

wherein said transverse portions of said third and fourth bus bars extend across said active surface of said semiconductor die;

attaching one end of a third bond wire to one bond pad of said plurality of bond pads and attaching an opposing end of said third bond wire to one bond finger of said at least two bond fingers on said third bus bar to electrically couple said one bond finger on said third bus bar to said one bond pad; and attaching one end of a fourth bond wire to one bond pad of said plurality of bond pads and attaching an opposing end of said fourth bond wire to one bond finger of said at least two bond fingers on said fourth bus bar to electrically couple said one bond finger on said fourth bus bar to said one bond pad.

32. The method of claim 31, wherein said first, second, third, and fourth bond wires have a substantially equal length and a substantially uniform loop height.

33. A method of manufacturing a semiconductor device package, comprising:

providing a semiconductor die including a first row of bond pads disposed proximate an edge of said semiconductor die on an active surface thereof and further including a second row of bond pads disposed proximate an edge of said semiconductor die on said active surface;

forming a plurality of lead fingers, each lead finger of said plurality of lead fingers including an outer end configured for electrical connection to an external device and an opposing inner end forming a bond area and terminating proximate said first row of bond pads;

forming a first bus bar including two outer lead fingers and a first transverse bar extending therebetween, each of said two outer lead fingers having at least a portion substantially parallel to said plurality of lead fingers and terminating at an end configured for electrical connection to said external device, said first transverse bar including a plurality of projections separated by recesses;

forming a second bus bar including two outer lead fingers and a second transverse bar extending therebetween, each of said two outer lead fingers having at least a portion substantially parallel to said plurality of lead fingers and terminating at an end configured for electrical connection to said external device, said second transverse bar including a plurality of projections separated by recesses, each projection on said first transverse bar extending into one of said recesses on said second transverse bar and terminating at an end forming a bonding zone, each projection on said second transverse bar extending into one of said recesses on said first transverse bar and terminating at an end forming a bonding zone;

wherein said plurality of lead fingers, said first bus bar, and said second bus bar comprise a lead-over-chip lead frame;

securing said semiconductor die to said lead frame, said first and second transverse bars extending across said active surface of said semiconductor die proximate said second row of bond pads;

coupling a first plurality of bond wires between at least a portion of said plurality of lead fingers and at least a portion of said first row of bond pads on said semiconductor die, each bond wire of said first plurality of bond wires including one end electrically connected to said bond area of one lead finger of said first plurality of lead fingers and an opposing end electrically connected to one bond pad of said first row of bond pads on said semiconductor die; and coupling a second plurality of bond wires between at least a portion of said projections of said first and second transverse bars and at least a portion of said second row of bond pads, each bond wire of said second plurality of bond wires including one end electrically connected to said bonding zone on one of said projections of said first and second transverse bars and an opposing end electrically connected to one bond pad of said second row of bond pads on said semiconductor die.

34. The method of claim 33, wherein all said bonding zones of said first and second transverse bars are substantially equidistant from said second row of bond pads on said semiconductor die and all bond wires of said second plurality of bond wires have a substantially uniform length and loop height.

35. The method of claim 34, wherein all bond wires of said first plurality of bond wires have a substantially uniform length and loop height.

36. The method of claim 35, wherein said uniform length and loop height of said first plurality of bond wires is different than said uniform length and loop height of said second plurality of bond wires.

37. A method of assembling a semiconductor device package, comprising:

providing a semiconductor device having a row of bond pads disposed on an active surface thereof adjacent an outer peripheral edge of said semiconductor die;

providing a lead-over-chip lead frame, said lead frame comprising:
  a plurality of lead fingers, each lead finger of said plurality of lead fingers including a bond area disposed at one end;
  a first bus bar including at least an inner-digitized portion, said inner-digitized portion including a plurality of alternating projections and recesses; and
  a second bus bar including at least an inner-digitized portion, said inner-digitized portion including a plurality of alternating projections and recesses, each projection of said plurality of alternating projections and recesses on said first bus bar extending into one recess of said plurality of alternating projections and recesses on said second bus bar and terminating at a bonding zone, each projection of said plurality of alternating projections and recesses on said second bus bar extending into one recess of said plurality of alternating projections and recesses on said first bus bar and terminating at a bonding zone;

securing said semiconductor die to said lead frame, said inner-digitized portions of said first and second bus bars traversing said active surface of said semiconductor die, said bonding area of said each lead finger disposed proximate said outer peripheral edge of said semiconductor die, said bonding zone of said each projection on said first bus bar and said bonding zone of said each projection on said second bus bar disposed proximate said row of bond pads on said semiconductor die;

electrically connecting said bonding area of at least one lead finger of said plurality of lead fingers to one bond pad of said row of bond pads on said semiconductor device;

attaching one end of a bond wire to said bonding zone of one projection on said first bus bar and attaching an opposing end of said bond wire to one bond pad of said row of bond pads on said semiconductor device; and attaching one end of at least one other bond wire to said bonding zone of one projection on said second bus bar and attaching an opposing end of said at least one other bond wire to one bond pad of said row of bond pads on said semiconductor device.

38. The method of claim 37, wherein a length of said bond wire is substantially the same as a length of said at least one other bond wire and a loop height of said bond wire is substantially the same as a loop height of said at least one other bond wire.

39. The method of claim 37, further comprising encapsulating said semiconductor die, at least said inner-digitized portions of said first and second bus bars, and a portion of said plurality of lead fingers with an encapsulant material.

40. The method of claim 37, further comprising:

providing a lead-over-chip lead frame further including:
  a third bus bar including at least an inner-digitized portion, said inner-digitized portion including a plurality of alternating projections and recesses; and
  a fourth bus bar including at least an inner-digitized portion, said inner-digitized portion including a plurality of alternating projections and recesses, each projection of said plurality of alternating projections and recesses on said third bus bar extending into one recess of said plurality of alternating projections and recesses on said fourth bus bar and terminating at a bonding zone, each projection of said plurality of alternating projections and recesses on said fourth bus bar extending into one recess of said plurality of alternating projections and recesses on said third bus bar and terminating at a bonding zone;

wherein said inner-digitized portions of said third and fourth bus bars traverse said active surface of said semiconductor die;

attaching one end of a third bond wire to said bonding zone of one projection on said third bus bar and attaching an opposing end of said third bond wire to one bond pad of said row of bond pads on said semiconductor device; and attaching one end of a fourth bond wire to said bonding zone of one projection on said fourth bus bar and attaching an opposing end of said fourth bond wire to one bond pad of said row of bond pads on said semiconductor device.

41. The device of claim 40, wherein said bond wire, said at least one other bond wire, said third bond wire, and said fourth bond wire have substantially the same length and loop height.

42. A method of assembling an integrated circuit device package, comprising:

providing an integrated circuit device having a plurality of bond pads disposed on an active surface thereof, said plurality of bond pads disposed proximate an outer peripheral edge of said integrated circuit device;

providing a lead frame, said lead frame including:
 a plurality of lead fingers, each lead finger of said plurality of lead fingers having one end configured for electrical connection to an external device and an opposing end configured for electrical connection to one bond pad of said plurality of bond pads on said integrated circuit device;
 a first bus bar including a transverse portion having opposing ends, each of said opposing ends forming an outer lead finger extending therefrom having at least a portion substantially parallel to said plurality of lead fingers and terminating at an end configured for electrical connection to said external device;
 a second bus bar including a transverse portion having opposing ends, each of said opposing ends forming an outer lead finger extending therefrom having at least a portion substantially parallel to said plurality of lead fingers and terminating at an end configured for electrical connection to said external device, said transverse portion of said second bus bar substantially parallel to said transverse portion of said first bus bar;
 a first plurality of alternating bond fingers and recesses on said transverse portion of said first bus bar, each bond finger of said first plurality of alternating bond fingers and recesses extending towards said transverse portion of said second bus bar and terminating at an end configured for electrical connection to at least one bond pad of said plurality of bond pads on said integrated circuit device;
 a second plurality of alternating bond fingers and recesses on said transverse portion of said second bus bar, each bond finger of said second plurality of alternating bond fingers and recesses extending towards said transverse portion of said first bus bar and terminating at an end configured for electrical connection to at least one bond pad of said plurality of bond pads on said integrated circuit device, at least one bond finger of said first plurality of alternating bond fingers and recesses extending into one recess of said second plurality of alternating bond fingers and recesses and at least one bond finger of said second plurality of alternating bond fingers and recesses extending into one recess of said first plurality of alternating bond fingers and recesses; and securing said integrated circuit device to said lead frame, said transverse portions of said first and second bus bars extending across said active surface of said integrated circuit device, said opposing end of said each lead finger terminating proximate said outer peripheral edge of said integrated circuit device;

electrically connecting said one end of at least one of said lead fingers of said plurality of lead fingers to one bond pad of said plurality of bond pads on said integrated circuit device;

electrically connecting said end of at least one bond finger of said first plurality of alternating bond fingers and recesses on said first bus bar to one bond pad of said plurality of bond pads on said integrated circuit device; and electrically connecting said end of at least one bond finger of said second plurality of alternating bond fingers and recesses on said second bus bar to one bond pad of said plurality of bond pads on said integrated circuit device.

43. The method of claim 42, wherein:

said act of electrically connecting said end of at least one bond finger on said first bus bar to one bond pad comprises electrically connecting one end of a bond wire to said end of said at least one bond finger on said first bus bar and electrically connecting an opposing end of said bond wire to said one bond pad;

said act of electrically connecting said end of at least one bond finger on said second bus bar to one bond pad comprises electrically connecting one end of another bond wire to said end of said at least one bond finger on said second bus bar and electrically connecting an opposing end of said another bond wire to said one bond pad; and said bond wire having a length and loop height substantially the same as a length and loop height of said another bond wire.

44. The method of claim 42, further comprising encapsulating said integrated circuit device, at least said transverse portions of said first and second bus bars, and said opposing end of said each lead finger in an encapsulant material.

45. The method of claim 42, further comprising elevating at least said transverse portions of said first and second bus bars to vertically offset said at least said transverse portions of said first and second bus bars from said active surface of said integrated circuit device.

46. A method of electrically connecting a bus bar pair of a lead frame to bond pads arranged in a row on an active surface of an integrated circuit device with bond wires having substantially uniform lengths and loop heights, said method comprising:

forming a first plurality of bond fingers and a first plurality of recesses on a first bus bar of said bus bar pair, one recess of said first plurality of recesses separating adjacent bond fingers of said first plurality of bond fingers;

forming a second plurality of bond fingers and a second plurality of recesses on a second bus bar of said bus bar pair, one recess of said second plurality of recesses separating adjacent bond fingers of said second plurality of bond fingers, each bond finger of said first plurality of bond fingers extending towards said second bus bar and into one recess of said second plurality of recesses, each bond finger of said second plurality of bond fingers extending towards said first bus bar and into one recess of said first plurality recesses, said each bond finger of said first and second pluralities of bond fingers terminating at a bonding target zone configured for electrical connection to one of said bond pads on said integrated circuit device, said bonding target zone of said each bond finger of said first and second pluralities of bond fingers lying substantially the same distance from said row of said bond pads on said integrated circuit device;

electrically connecting one end of one said bond wire to said bonding target zone on one bond finger of said first plurality of bond fingers and electrically connecting an opposing end of said one said bond wire to one of said bond pads on said integrated circuit device; and electrically connecting one end of another said bond wire to said bonding target zone on one bond finger of said second plurality of bond fingers and electrically connecting an opposing end of said another bond wire to one of said bond pads on said integrated circuit device.

\* \* \* \* \*

UNITED STATES PATENT AND TRADEMARK OFFICE
CERTIFICATE OF CORRECTION

PATENT NO. : 6,376,282 B1 Page 1 of 1
APPLICATION NO. : 09/521056
DATED : April 23, 2002
INVENTOR(S) : David J. Corisis It is certified that error appears in the above-identified patent and that said Letters Patent is hereby corrected as shown below:

In the specification:
COLUMN 6, LINE 30, change "$5c$ and $51d$." to --$51c$ and $51d$.--

In the claims:
CLAIM 1, COLUMN 9, LINE 28, change "equalize the" to --equalize--
CLAIM 6, COLUMN 10, LINE 53, change "equalize the loop" to --equalize loop--

Signed and Sealed this

Twentieth Day of November, 2007

JON W. DUDAS
*Director of the United States Patent and Trademark Office*